(12) United States Patent
Daniels

(10) Patent No.: US 6,356,080 B1
(45) Date of Patent: Mar. 12, 2002

(54) DEVICE TO MEASURE THE POLARIZATION OF A HYPERPOLARIZED RESONANT SUBSTANCE

(76) Inventor: James Maurice Daniels, 40 Cranbury Rd., Princeton Junction, NJ (US) 08550-1231

( * ) Notice: Subject to any disclaimer, the term of this patent is extended or adjusted under 35 U.S.C. 154(b) by 0 days.

(21) Appl. No.: 09/406,351

(22) Filed: Sep. 28, 1999

(51) Int. Cl.[7] ................................................ G01V 3/00
(52) U.S. Cl. ...................... 324/313; 324/309; 324/318; 324/322
(58) Field of Search ................................ 324/313, 318, 324/309, 322; 600/420

(56) References Cited

U.S. PATENT DOCUMENTS 5,969,526 A * 10/1999 Duerr ......................... 324/318

FOREIGN PATENT DOCUMENTS

WO     WO 01/01164 A2 *  1/2001  ........... G01R/33/28

* cited by examiner

Primary Examiner—Jay Patidar
Assistant Examiner—Brij B. Shrivastav

(57) ABSTRACT

A device for measuring the polarization of a hyperpolarized resonant substance; in a particular embodiment a hyperpolarized noble gas. A specimen of the hyperpolarized substance is made one component of a coupled oscillator, the other component being a resonant electric circuit. Such a coupled system has, in general, two stable modes of oscillation, and their frequencies are related to various parameters of the system, including the polarization of the specimen of hyperpolarized substance. The polarization can therefore be deduced from these frequencies.

4 Claims, 3 Drawing Sheets

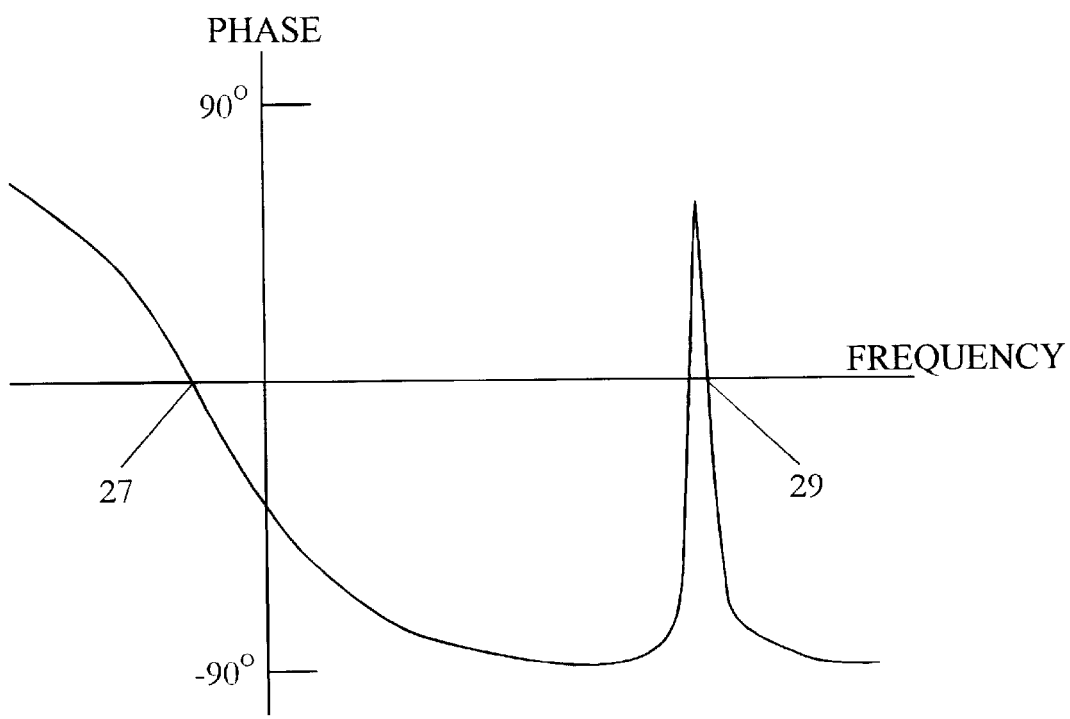
Fig. 3-A
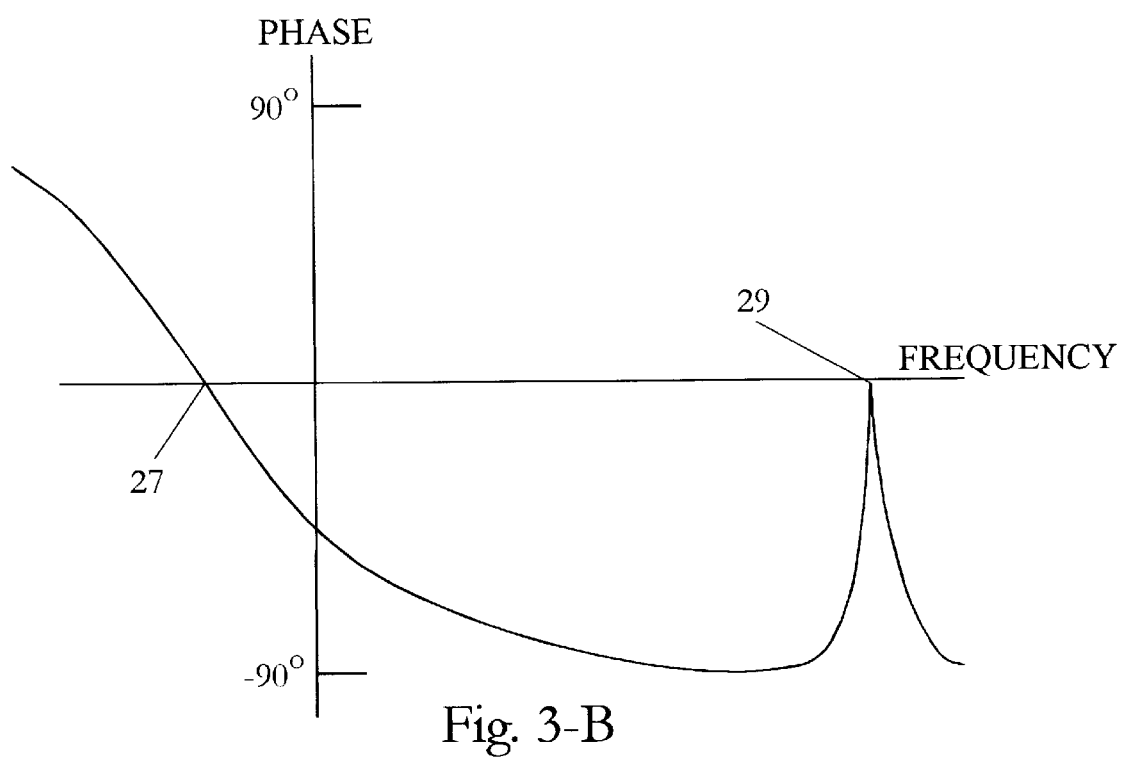
Fig. 3-B

DEVICE TO MEASURE THE POLARIZATION OF A HYPERPOLARIZED RESONANT SUBSTANCE

STATEMENT REGARDING FEDERALLY SUPPORTED RESEARCH AND DEVELOPMENT

Not applicable

BACKGROUND—FIELD OF INVENTION

This invention relates to the measurement of the polarization of a "hyperpolarized resonant" substance; that is, a substance whose nuclear or electron spins are not in thermal equilibrium (hyperpolarized), and which exhibit magnetic resonance.

BACKGROUND—DESCRIPTION OF PRIOR ART

This invention describes an instrument which can measure the polarization of any hyperpolarized resonant substance. However, the description of its operation will be illustrated using hyperpolarized $^3$He as an example.

There are two methods which have been used to measure the polarization of hyperpolarized $^3$He:

One is to apply a pulse of radio frequency energy at the resonant frequency of the $^3$He nuclei (e.g. M. Leduc, P. J. Nacher, D. S. Betts, J. M. Daniels, G. Tastevin and F. Laloë. Europhys. Lett. 4, 59–64 (1987)). This tips the polarization vector away from the direction of the guide field. The component of the polarization parallel to the guide field remains; the component perpendicular to the guide field induces a signal (the free induction decay) as it decays. The size of this signal is proportional to the polarization. If θ is the angle through which the polarization vector is tipped, the sensitivity is proportional to sin θ, and the polarization remaining is proportional to cos θ. Typically useful values of θ are 5° to 10°. With θ=10°, half the polarization is lost after 47 measurements. This method can be performed using a standard MRI installation, but modifications are required which may be impossible on a commercially available machine. Apart from difficulties and inconveniences in handling the sample, this is very much like "doing the experiment and finding out afterwards what the polarization was."

Another method is to strike a discharge in the polarized $^3$He. This creates a mixture of ions and excited states which come into equilibrium with the ground state polarized $^3$He, and their polarization can be measured by optical means (J. M. Daniels and R. S. Timsit. Canad. J. Phys. 49, 539–544 (1971). M. Pinard and J. van der Linde. Canad. J. Phys. 52, 1615–1631 (1974)). This couples the hyperpolarized ground state to the outside world, and promotes rapid relaxation.

This method is not suitable for use at a remote site, since it essentially requires setting up the equipment to produce the hyperpolarized gas. In addition, the whole sample which is measured is usually destroyed.

The two methods, at present in use, for determining the polarization of a hyperpolarized substance suffer from the disadvantage that, in measuring the polarization, at least some of the polarization is destroyed. Often the polarization of the sample is totally destroyed, and the sample has to be discarded. For this reason, they cannot be used too often.

SUMMARY

The invention described here is a self contained instrument for measuring the polarization of a sample of hyperpolarized material. It can be used independently of any other installation, and it causes minimal (essentially no) disturbance of the polarization of the sample. Continuous monitoring of the polarization is possible.

OBJECT AND ADVANTAGES

A use has recently been proposed for hyperpolarized noble gases in clinical Magnetic Resonance Imaging.

A hyperpolarized substance is unstable, and eventually relaxes back to thermal equilibrium. The time for hyperpolarized $^3$He to relax can vary between a fraction of a second and a week, depending on the conditions under which it is held. There is thus a need to be able to measure its polarization, and this will become more urgent when hyperpolarized $^3$He becomes a commercial commodity.

A situation is now envisioned where hyperpolarized noble gases are produced in a central location, and are shipped to distant sites for use, maybe on arrival, maybe at some future time within a few days. There are good reasons to be able to measure the polarization; for example, when the shipment arrives to verify that what has been sent is what was expected, or just before use to monitor the quality of the results.

This invention has, as its objective, a portable self contained instrument which can be used to measure the polarization with minimal (essentially no) destruction of polarization. This will permit continuous monitoring of the polarization, if desired.

The features of this invention which permit this are:

a. The specimen is in a radio frequency field, but this is a very weak field, not much stronger than the thermal circuit noise, in contrast to the "tipping angle" method which uses a strong pulse of radio frequency energy to tip the polarization vector, and b. The frequency of this weak radio frequency field is always different from the resonant frequency of the spins of the hyperpolarized material being measured.

The Principle of Operation

The physical basis of this invention is the well known fact that two coupled resonant systems, (that is, mechanical or electrical systems which can perform free periodic motion) whose resonant frequencies are the same or almost the same, have two stable modes of oscillation. The frequencies of these two modes are different from each other, and also different from the resonant frequencies of the individual resonant systems. (Horace Lamb, "Higher Mechanics," 2nd. Ed. Ch. 11, Sec. 90, pp. 219–222 Cambridge University Press (1943), Herbert Goldstein, "Classical Mechanics," Ch. 16, Secs. 10.2 and 10.3, pp. 321–333 Addison Wesley (1950), Frederic Emmons Terman, "Radio Engineers' Handbook," pp. 154–164 McGraw Hill (1943)).

Another feature of such systems is that, when the system is incorporated in a feedback circuit so that sustained oscillations are set up, as the parameters of the system are varied, the system can jump from one mode of oscillation to the other. These jumps are seen frequently in radio circuits, due to non-linearities of the circuit parameters, and in circuits containing gas discharges. They have also been observed in a circuit containing a hyperpolarized gas. (R. S. Timsit and J. M. Daniels. Rev. Sci. Instrum. 47, 953–959 (1976)). It was recognized that this phenomenon was related to the polarization, however, this experiment has never been repeated, and the conditions and limitations of the use of this phenomenon for the measurement of polarization were not investigated.

Various embodiments have since been modelled on a computer (unpublished) and indeed this phenomenon can be used as a basis for a polarimeter.

There are several methods of detecting a mode switch, including, but not limited to, a change in frequency, and a change in the impedance of the resonant circuit resulting in a jump in the voltage across the circuit, or a jump in the current in the circuit. The polarization is most conveniently deduced from the difference in frequency of the two modes, or from the jump in frequency when the modes switch. This frequency jump can be displayed using conventional digital frequency counters, or an analogue frequency meter using the charging and discharging of a capacitor, or the output can be heterodyned into the audible range for an immediate and rough indication.

Most convenient would be automatic operation where the parameters of the oscillator are cycled through a predetermined sequence, and the frequency measurements are processed into a final result; this can be done with dedicated circuits, or an interfaced computer, or a combination of both.

DESCRIPTION OF THE DRAWINGS

FIG. 3-A is a graph of phase shift as a function of frequency, showing the conditions for stable oscillation.

FIG. 3-B is a graph of phase shift as a function of frequency, showing the conditions at the instant of a mode switch.

LIST OF REFERENCE NUMERALS

1. The flask to hold a specimen of hyperpolarized noble gas.
3. The inductor of the resonant electric circuit.
5. Coils for trimming the guide field.
7. Coils for producing a guide field.
9. The capacitor of the resonant electric circuit.
11. Amplifier, part of the feedback loop of the coupled oscillator.
13. Voltage limiting circuit, whose output is independent of the input voltage. Part of the feedback loop of the coupled oscillator.
15. Feedback resistor.
17. Buffer amplifying stage.
19. Filter.
21. Output device.
23. Mode switch detecting circuit.
25. Programmed current source.
27. Frequency of one mode of stable oscillation, where the phase shift is zero.
29. Frequency of another mode of stable oscillation, where the phase shift is zero.

DESCRIPTION—Preferred Embodiment

In the preferred embodiment, the device comprises two units:
a) The measuring head, and
b) The electronic control module.

Figure 1:
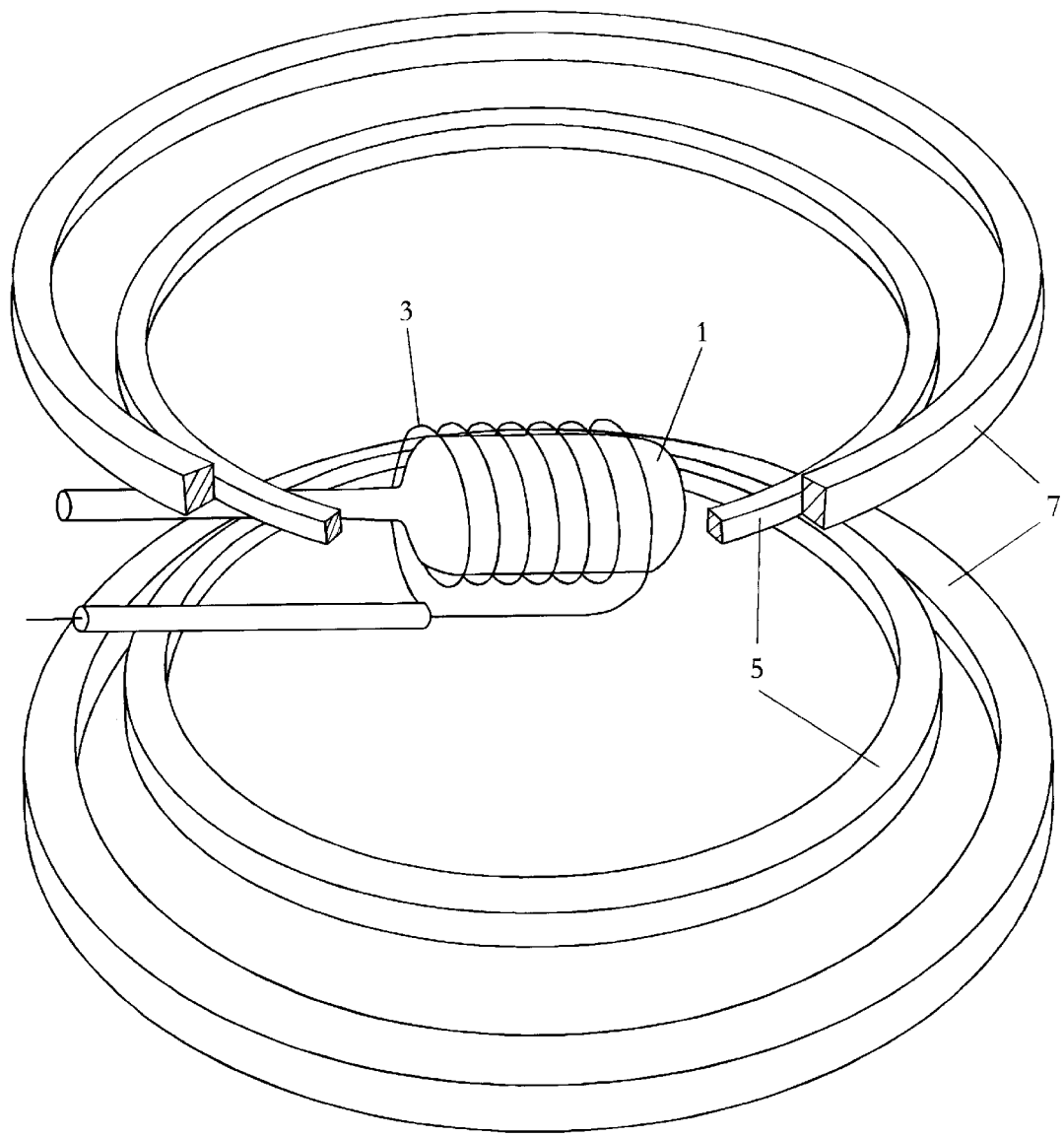
FIG. 1 is a perspective view of the measuring head.

The measuring head is shown in FIG. 1. It comprises a flask (1) made of some material, such as Corning 1720 glass, which does not relax hyperpolarized $^3$He, to hold the sample of gas to be measured. The coil (3) is the inductor of a parallel resonant circuit. Coil (3) surrounds flask (1) and its axis is perpendicular to the guide field. There are two sets of coils,(5) and (7). Set (7) is to produce a guide field, and set (5) is to produce a smaller field to vary the guide field within certain predetermined limits, and to sweep it. Coil sets (5) and (7) are coil configurations which produce a homogeneous magnetic field over the volume of flask (1). Many such configurations are possible; FIG. 1. shows Helmholtz pairs.

It can be expected that this instrument might be dedicated to use in some predetermined environment. For example, one might be incorporated in a container for transporting hyperpolarized gas over long distances. The precise configuration of coil sets (5) and (7) will be chosen according to the environment in which the device is to be operated; for example, if the device is to be dedicated to monitor polarization in an environment where a guide field is provided, coil set (7) will be omitted. Not shown are mounting brackets to hold the components of the measuring head; these are to be made of a non-magnetic insulating material such as hard plastic.

Also not shown is a manometer to measure the pressure of the gas in flask (1). Such a manometer can be provided, but it is expected that the gas handling system for handling the hyperpolarized $^3$He will have a manometer, or some other method of knowing the pressure.

Inductor (3) is connected to the electronic module by means of a coaxial cable. Flask (1) will be connected to the source of hyperpolarized $^3$He to be measured by means of a tube in the usual way.

Figure 2:
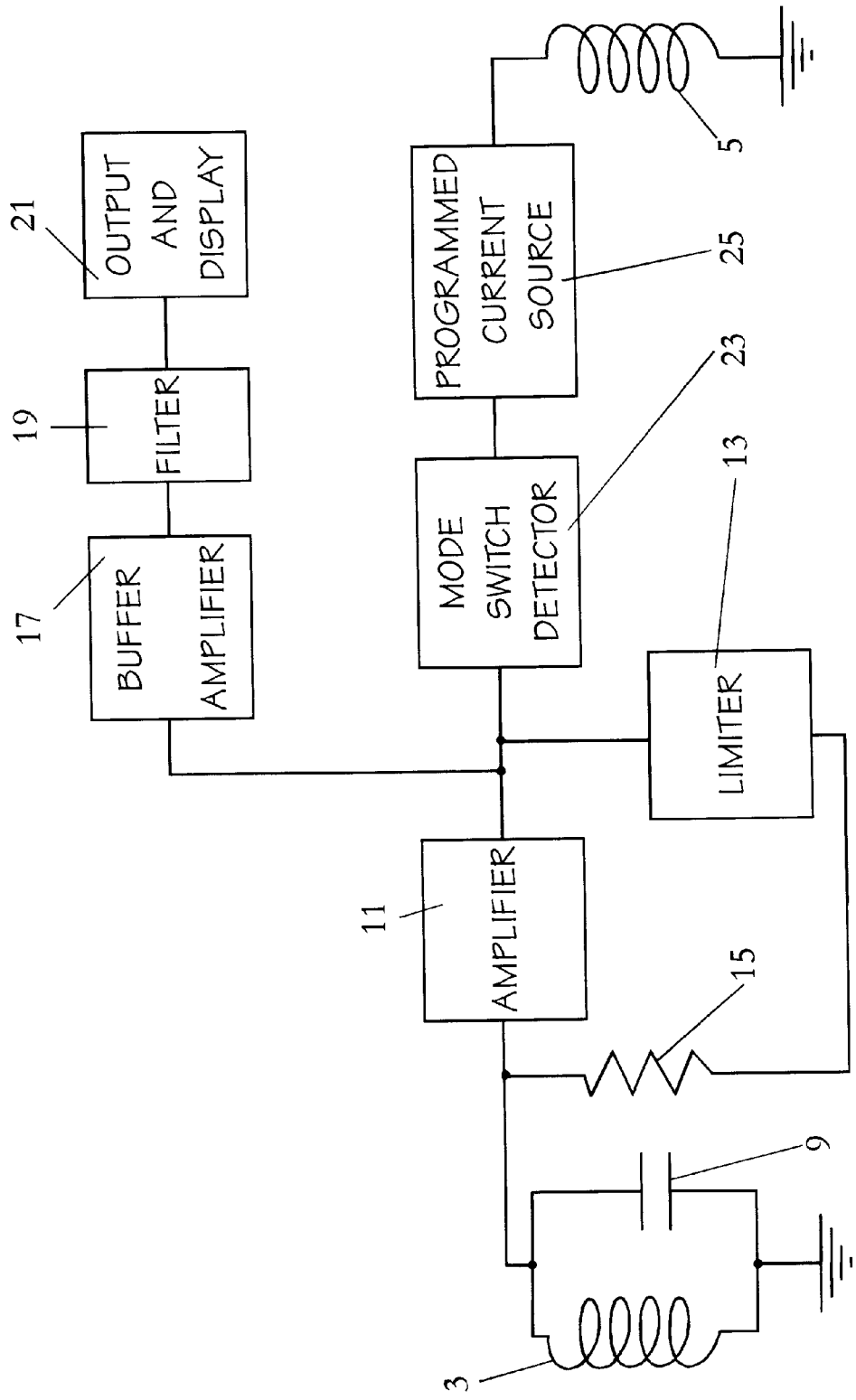
FIG. 2 is a block diagram of the electronic control module.

FIG. 2 is a block diagram of the electronic control module. The essential part is a low level oscillator of the type described by Robinson (F. N. H. Robinson. J. Sci. Instrum. 36, 481–484, 484–487 (1959)). This oscilator consists of:

a) A resonant circuit, in this embodiment the resonant circuit consists of inductor (3) and a capacitor (9). Capacitor (9) may be located in the measuring head, or in the electronics control module, as may be convenient.

b) An amplifier (11), which has a high gain, e.g. $10^5$, and zero phase shift from D.C. to a high frequency, e.g. e.g. 30 MHz.

c) A voltage limiting circuit (13) whose output is independent of the magnitude of the input.

The output from voltage limiter (13) is fed through a resistor (15) to the input of amplifier (11) to complete the feedback circuit. Resistor (15) is adjusted to maintain oscillations at a very low level.

The output from amplifier (11) is fed into a buffer amplifying stage (17) whose function is as a matching and isolating circuit. Its output is fed through a filter (19), which extracts a harmonic of the oscillator output which has a bigger signal to noise ratio than the fundamental. The output from filter (19) is input to the output and display circuits (21), which would be one of the possibilities mentioned in the previous section.

The output from amplifier (11) is also fed into a circuit (23) which detects a mode switch from the jump in the amplitude of the output of amplifier (11). Mode switch detector (23) sends a signal to a programmable controller (25) which controls the current in the coil set (5) which trims the guide field.

One programmable mode of operation is to sweep the guide field, measuring and recording the frequency of the oscillator until a mode switch is detected. The frequency would then be redetermined, and the frequencies of the oscillator just before and just after the mode switch would be sent to a computer to evaluate the polarization of the sample of hyperpolarized gas in flask (1).

FIGS. 3-A and 3-B illustrate the sequence of events in a mode switch. The oscillator oscillates at a frequency where the phase shift round the feedback loop is zero. FIG. 3-A, where phase shift is plotted against frequency, shows the general case. The origin of the graph is the resonant frequency of the circuit consisting of inductor (3) and capacitor (9) unloaded. The hyperpolarized gas introduces a peak in the graph of phase shift against frequency, seen to the right of the origin in the figures, and stable oscillations are possible at the frequencies denoted by the zero crossings (27) and (29).

When the guide field is increased, the resonant frequency of the hyperpolarized gas is also increased, and the peak moves to higher frequencies. Eventually, the peak dips below the zero phase line, as shown in FIG. 3-B, and the mode (29) is no longer possible.

If the oscillator is originally oscillating in mode (29), as shown in FIG. 3-A, as the guide field is swept to higher values, when the position shown in FIG. 3-B is reached oscillator switches to the other mode, and the frequency jumps from the value denoted by the point (29) on FIG. 3-B to the value denoted by point (27) on the same figure. An analogous frequency jump occurs when the guide field is swept in the reverse direction.

Conclusion, Ramifications, and Scope of Invention

Other embodiments are possible and envisioned besides the one described in the previous section. The essential part of this invention is the low power bimodal oscillator. The rest is a convenient control and readout system, which can be varied according to the environment where measurements of polarization are to be made, and according to the requirements of the operator.

The values which are to be determined, and from which the polarization is deduced are the two stable frequencies of oscillation of the coupled system. Other factors which enter into this calculation are the parameters which can be set, of which there are five:—(i) the resonant frequency of the resonant electrical circuit, (ii) the resonant frequency of the hyperpolarized specimen, (iii) the Q-factor of the resonant electrical circuit, (iv) the Q-factor, or line width, of the hyperpolarized specimen, and (v) the coefficient of coupling as understood in radio engineering. These five parameters can be set in many ways by varying the values of the circuit elements, all of which lead to the same result, and the choice of which is also a matter of convenience. However, it is normal to ensure that the line width of the hyperpolarized specimen, which does enter into the calculation of the polarization, is as narrow as possible, since factors which cause broadening are, in general, those which promote relaxation.

In the embodiment described, variation of the parameters of the coupled oscillator are made by varying the magnitude of the guide field, however the same can be achieved by varying the parameters of the resonant circuit. This might be done by any of the methods known in radio engineering, e.g. by using a voltage controlled capacitor, or a circuit whose input impedance looks like a capacitor, or by varying the inductance, say mechanically. The coupling between the two components might also be varied, as might also be the effective Q-value of either component.

The inductive coupling used in this embodiment is not the only way two resonant entities can be coupled, and other methods of coupling, such as link coupling, might offer advantages in certain environments (Frederic Emmons Terman, "Radio Engineers' Handbook." Pp. 162–170, McGraw Hill (1943)).

The advantage which this invention offers over other known methods of measuring polarization is that it hardly disturbs the polarization of the sample being measured. This is due to two facts:

a) The radio frequency field applied to the sample is very weak, and b) The stable frequencies of oscillation are both different from the resonant frequency of the hyperpolarized specimen.

The embodiment described in the previous section employs a certain kind of low level oscillator, chosen for its stability. Other low level oscillators might be used, (see e.g. R. V. Pound and W. D. Knight. Rev. Sci. Instrum. 21,219 (1950)).

The difference between the resonant frequency of the hyperpolarized substance and each of the stable frequencies of oscillation depends on the parameters of the coupled system. Thus the control of these parameters (e.g. the sweep cycle of the guide field in the embodiment described in the previous section) can be adjusted to maximize this difference as far as possible.

I claim:

1. A device, for measuring the magnitude of the polarization vector of a sample of a hyperpolarized resonant substance, comprising a) a low level electrical oscillator incorporating a resonant electric circuit, b) a sample container contained inside the inductor of said resonant electric circuit, c) a system of coils to produce and/or modify a guide field which maintains the direction of the polarization vector of said hyperpolarized resonant substance, and d) circuits to control the device, and a display indicating the final value of the magnitude of the polarization vector.

2. The device of claim 1 wherein said hyperpolarized resonant substance is a hyperpolarized noble gas.

3. The device of claim 1 wherein said low level electrical oscillator comprises a high gain wide band amplifier and a voltage limiting circuit.

4. The device of claim 1 wherein said circuits to control the device include an interface to a computer or other programmable device.

* * * * *